United States Patent
Atarashi et al.

(10) Patent No.: US 7,721,788 B2
(45) Date of Patent: May 25, 2010

(54) COOLING JACKET

(75) Inventors: Takayuki Atarashi, Tsuchiura (JP); Masato Nakanishi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 805 days.

(21) Appl. No.: 11/393,780

(22) Filed: Mar. 31, 2006

(65) Prior Publication Data

US 2006/0219387 A1    Oct. 5, 2006

(30) Foreign Application Priority Data

Apr. 1, 2005    (JP)   ............................ 2005-105844

(51) Int. Cl.
*F28F 7/00* (2006.01)

(52) U.S. Cl. ...................... 165/80.2; 165/185

(58) Field of Classification Search ................ 165/80.1, 165/80.2, 80.3, 80.4, 80.5, 104.33, 185
See application file for complete search history.

(56) References Cited

U.S. PATENT DOCUMENTS

| | | | |
|---|---|---|---|
| 4,558,395 A | | 12/1985 | Yamada |
| 5,006,924 A | * | 4/1991 | Frankeny et al. ............ 165/80.4 |
| 5,132,780 A | | 7/1992 | Higgins, III |
| 5,274,920 A | * | 1/1994 | Matthews .................. 165/80.4 |
| 6,367,543 B1 | * | 4/2002 | Calaman et al. ............ 165/80.4 |
| 6,397,932 B1 | * | 6/2002 | Calaman et al. ............ 165/80.4 |
| 2002/0070006 A1 | | 6/2002 | Mok |
| 2003/0029601 A1 | | 2/2003 | Johnson |

FOREIGN PATENT DOCUMENTS

| | | |
|---|---|---|
| EP | 0 641 023 | 3/1995 |
| EP | 1 175 135 | 1/2002 |
| JP | 06-266474 | 9/1994 |
| JP | 07-142886 | 6/1995 |

* cited by examiner

*Primary Examiner*—Ljiljana (Lil) V Ciric
(74) *Attorney, Agent, or Firm*—Antonelli, Terry, Stout & Kraus, LLP.

(57) ABSTRACT

A cooling jacket for cooling a heat-generating element through transmitting heat-generation into a coolant flowing within an inside of the cooling jacket, which is mounted within an electronic apparatus, and includes a base portion, and a cover portion. The base portion includes a heat-transfer surface in proximity to a surface of the heat-generating element, and a plurality of wall portions. Each wall portion is defined to extend into a direction perpendicular to the heat-transfer surface, thereby defining flow passages for the fluid coolant between the wall portions. The cover portion is attached on the base portion surrounding a periphery of the base portion, thereby defining a passage for guiding the fluid coolant into the base portion. The base portion builds up the sector-shaped flow passages and a summit portion at a central portion of the base, and has a configuration that is thermally isotropic to the heat-generating element.

10 Claims, 2 Drawing Sheets

COOLING JACKET

BACKGROUND OF THE INVENTION

The present invention relates to a cooling jacket for transmitting heat-generation into a liquid refrigerant or coolant flowing within an inside thereof, and in particular, it relates to a cooling jacket to be used within a liquid cooling system, for enabling effective cooling of a heat-generating element, within various kinds of electronic apparatuses mounting the said heat-generating element therein, i.e., a semiconductor integrated circuit element, within an inside thereof, such as, a desk-top type personal computer and a server, and further a notebook-type personal computer, etc.

Conventionally, each of the electronic apparatuses, such as, the desk-top type personal computer and the server, and further the notebook-type personal computer, comprises the semiconductor element, as being the heat-generating element, such as, a CPU (Central Processing Unit), representatively, and for this reason, in general, it necessitates cooing for maintaining a normal operation of the said heat-generating element. Conventionally, for achieving such the cooling is applied, in general, so-called a cooling system of air-cooling type, wherein a heat-transferring member, being formed with fins in one body and called by "heat sink", is attached on the said heat-generating element, thermally connected therewith, while providing a fan for blowing a cooling air thereon.

However, in recent years, accompanying with the tendency of small-sizing and high-integration of the semiconductor integrated circuit element, as being the heat-generating element, and further with high performances thereof, heat-generation is increased in such the heat-generating element, and at the same time localization is also generated, in particular, relating to heat-generating portions thereof. For this reason, attentions are paid on a liquid cooling-type cooling system having high cooling efficiency, which applies water as the coolant thereof, for example, in the place of the conventional air-cooling type cooling system, and it is actually adopted.

As such liquid cooling-type cooling system having high cooling efficiency, to be applied in the electronic apparatus, as was mentioned above, as was already known by the following Patent Documents, etc., in general, a member, being so-called a "heat-receiving jacket" or "cooling jacket", is mounted on the surface of the CPU, as being the heat-generation body, directly, while running a liquid coolant within a flow passage, which is formed within an inside of the heat-receiving jacket. Thus, the heat-generation from the CPU is transmitted into the coolant flowing within the above-mentioned jacket, and thereby cooling the heat-generation body at high efficiency. However, in such the cooling system of liquid cooling type, normally, a heat cycle is built up with using the cooling jacket mentioned above as a heat-receiving portion, and in more details thereof, it comprises a circulation pump for circulating the liquid coolant within the cycle, a radiator to be a heat radiation portion for radiating heat of the liquid coolant into an outside, and further a coolant tank provided in a part of the cycle, depending on the necessity thereof, for storing the liquid coolant therein, and wherein, those are connected through metal tubes or tubes made of an elastic body, such as, rubber, etc., for example.

Patent Document 1: Japanese Patent Laying-Open No. Hei 6-266474 (1994); and

Patent Document 2: Japanese Patent Laying-Open No. Hei 7-142886 (1995).

By the way, within the liquid cooling system of actively circulating the liquid coolant within the system, as was known by the conventional arts mentioned above, the cooling jacket for transmitting the heat from the heat-generation body into the liquid coolant, in general, has such the structures that the flow passage for the liquid coolant is formed within a housing made of a metal, such as, copper or aluminum, etc., or that a metal pipe is welded on a metal plate. However, in recent years, accompanying with an increase of heat value within the heat-generating element, in particular, it is strongly demanded to improve the cooling capacity thereof, and for example, with the radiator, an electromotive fan is further attached thereon, so as to accelerate the heat radiation, compulsively. However, it cannot be said necessarily that sufficient improvements are made, in relation to an improvement of the cooling jacket, in particular, the heat conduction thereof.

Thus, as is apparent from the mentioned above, within the cooling jacket of the conventional art, the liquid coolant cooled down in the radiator flows into the flow passage formed within the metal housing thereof. In that instance, on a base portion of the cooling jacket (i.e., a metal plate portion to be in contact with a surface of the heat-generating element), the heat generated from the LSI, for example, is transferred into the liquid coolant through diffusion thereof; however, with the cooling jacket having such the conventional structures, since the said base portion thereof has only wall portions a plural number thereof, which are formed on a metal plane plate, for enlarging an area of contacting with the liquid coolant, therefore the heat can diffuse into direction of the plane on the metal plate, but it has such the structure that the heat can hardly diffuse into the vertical direction (i.e., into the wall portions). Thus, with the cooling jacket of the conventional art, the heat cannot be transferred effectively from the wall portions to the liquid coolant, even if enlarging the area to be contacted with the liquid coolant by means of the wall portions, and therefore it has a large heat resistance. For this reason, there is pointed out a drawback that it is not always possible to obtain the sufficient cooling capacity with it.

BRIEF SUMMARY OF THE INVENTION

Then, the present invention is accomplished by taking such drawbacks into the consideration thereof, and in more details; it is an object to provide a cooling jacket, for reducing the heat resistance through an improvement on the heat transfer from the heat-generating element, and thereby being superior in the cooling capacity thereof.

For accomplishing the object mentioned above, according to the present invention, there is provided a cooling jacket for cooling a heat-generating element through transmitting heat-generation therein into a coolant flowing within an inside thereof, which is mounted within an electronic apparatus, comprising: a base portion being built up with flow passages therein; and a cover portion, wherein said base portion being comprises a heat-transfer surface to be contact on a surface of said heat-generating element, a projecting portion extending into a direction perpendicular to said heat-transfer surface, and a plural number of wall portions, each being formed to extend into a direction perpendicular to said heat-transfer surface and to said projecting portion, thereby defining flow passages for the liquid coolant between said plural number of wall portions, and said cover potion is attached on said base portion surrounding a periphery thereof, and thereby defining a flow passage for guiding the liquid coolant into said base portion.

Also, according to the present invention, within the cooling jacket as is described in the above, it is preferable that said projecting portion of said base portion is shaped so that width thereof is narrowed as it separates from a center of said heat-transfer surface, or that the flow passage for the liquid coolant, which is defined between the wall portions of said base portion is sector-like in configuration thereof. Further, it is preferable that said projecting portion of said base portion forms a summit portion with respect to a central portion of said heat-transfer surface, and thereby defining the sector-like flow passages for the liquid coolant on both sides of said summit portion.

In addition thereto, according to the present invention, for accomplishing the object mentioned above, there is also provided a cooling jacket for cooling a heat-generating element through transmitting heat-generation therein into a coolant flowing within an inside thereof, which is mounted within an electronic apparatus, comprising: a base portion having a heat-transfer surface to be contact with a surface of said heat-generating element, and a plural number of wall portions, each being defined to extend into a direction perpendicular to said heat-transfer surface, and thereby defining flow passages for the liquid coolant between said plural number of wall portions; and a cover portion, being attached on said base portion surrounding a periphery thereof, thereby defining a passage for guiding the liquid coolant into said base portion, wherein said base portion has a configuration being thermally isotropic to said heat-generating element to be contact on said heat-transfer surface.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, embodiments according to the present invention will be fully explained by referring to the attached drawings.

Figure 1:
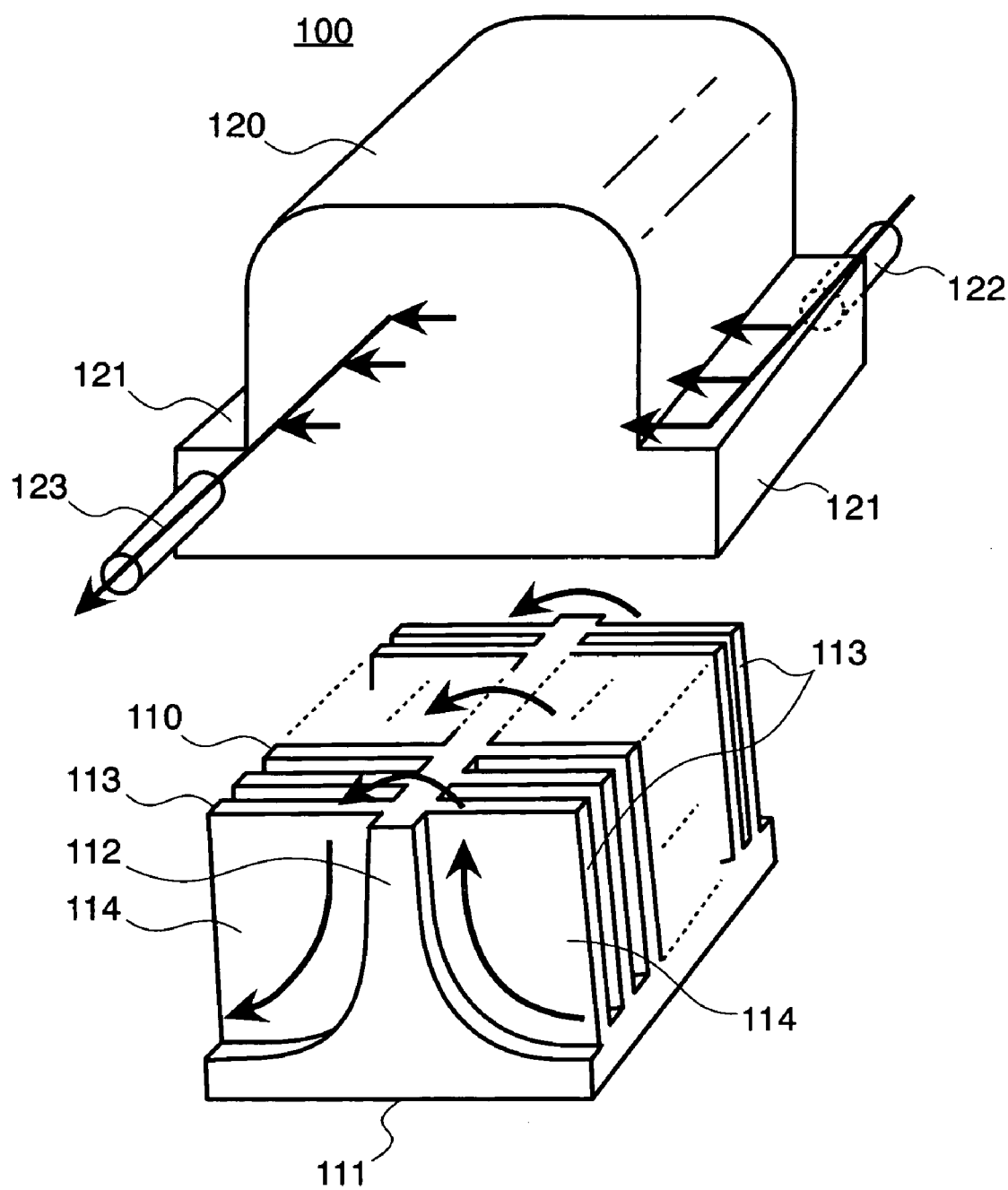
FIG. 1 is an exploded perspective view for showing the entire structures of a cooling jacket, according to an embodiment of the present invention.

First of all, FIG. 1 attached herewith shows the structures of a cooling jacket, according to an embodiment of the present invention, through the exploded perspective view thereof. However, this cooling jacket builds up so-called a part of a liquid cooling system together with a radiator, a driving pump, and a tank, etc., though not shown herein, within an electronic apparatus including the heat-generating element (for example, the CPU, etc.) within an inside of a housing thereof, such as, the desk-top type personal computer and the server, and further the notebook-type personal computer, etc., for example. Further, those constituent parts are connected through metal tubes or the like, and an inside thereof is enclosed a liquid refrigerant or coolant, such as, water and/or ethylene glycol, for example.

The cooling jacket 100 according to the present invention, as is apparent from the figure, has a base portion 110, which is made of a metal, such as, copper or aluminum, etc., for example, being superior in the heat conductivity, and a cover portion 120 to be covered on the said base portion 110, surrounding a periphery thereof. Further, this base portion 110 builds up a heat-transfer surface 111 on a lower surface thereof, to be in contact on a surface of the heat-generating element, such as, the CPU mentioned above, representatively, through a heat-conductive grease or the like. Also, this base portion 110 includes a solid (or an inside) portion having summit portions 112 at a central portion thereof, and building up a plural number of wall portions 113, 113 . . . , extending in directions perpendicular to the heat-transfer surface 111 and also perpendicular to the summit portions 112. And, as is apparent from the figure, between those plural numbers of wall portions 113 are defined flow passages 114, each having a sector or a fan-like shape, approximately, in a large number thereof, while being piled up into the direction of the summit portion 112.

On the other hand, onto the base portion 110 will be attached the cover portion 120, which is shaped into a box-like, approximately, in an outer configuration thereof, so that it surrounds the periphery thereof from an upper portion thereof. Further, at portions of the cover portion 120 (in front and back of a lower guide portion 121) are attached an inlet pipe 122 for running the liquid coolant into an inside thereof and an outlet pipe 123 for discharging the coolant into an outside thereof. Also, the cover portion 120 is attached onto the base portion 110, in a liquid-hermetical manner. For this reason, the liquid coolant running therein from the inlet pipe 122, as is shown by arrows in the figure, pass through the flow fan-shaped passages 114, each of which is defined between the wall portion 113 and 113, from the guide portion 121, and is collected, once, in an upper portion of the cover portion 120. Thereafter, passing through the fan-shaped passages 114, each of which is defined between other wall portion 113 and 113 (i.e., on the left-hand side in the figure), it reaches to the guide portion 121, and it is discharged from the outlet pipe 123 into the outside thereof.

Figure 2:
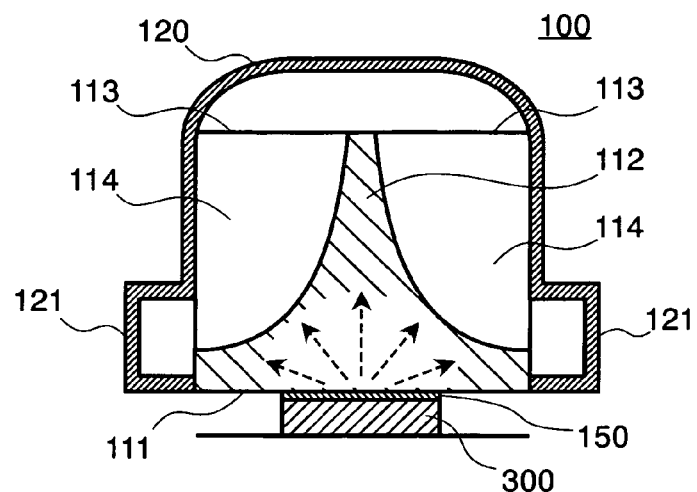
FIG. 2 is a view for explaining heat diffusion of a heat-generating body within the cooling jacket mentioned above.

In this instance, as is shown in FIG. 2 attached herewith, upon the heat-transfer surface 111 of the base portion 110 is contacted an LSI chip 300, as being the heat-generating body, while putting a grease 150 or the like, being superior in the heat-conductivity thereof, between them, for example; i.e., they are thermally connected with. For this reason, heat generated from this heat-generating body 300 can diffuses, not only into the horizontal direction along the heat-transfer surface 111 of the base portion 110, but also into the direction towards the summit portion 112 of the base portion 110 (i.e., the vertical direction), too (see arrows of broken lines in the figure). Thus, with such structures of the base portion 110 as was mentioned above, it is possible to diffuse the heat of the heat-generating body 300, which is disposed on the heat-transfer surface in contact therewith, isotropically and into various directions, and thereby achieving an effective heat transfer into the liquid coolant flowing between the walls, through the wall portions 113. For this reason, it is possible to lower the heat resistance within the said base portion 110, and thereby enabling to increase the efficiency of the cooling jacket 100, greatly.

However, in case when consideration is taken to increase the isotropic heat diffusion from the heat-transfer surface and also the surface area of the wall portions as large as possible, in the structures mentioned above, it is preferable that the solid portion (i.e., a hatching portion) of the base portion is extended or elongated, with respect to the heat-transfer surface 111, i.e., into the horizontal direction and also the vertical direction from a center of the heat-transfer surface, and further that the width thereof comes down to be small, gradually, as it separates from the center of the respective heat-transfer surfaces. However, it may be more simplified in the configuration thereof (for example, the width of the respective ones come to be small, linearly, depending on the distance from the heat-transfer surface (such as, a flow passage 114 of being about triangle in the shape), or being equal in the width without change thereof (such as, a flow passage of being rectangular in the shape)), and also in such cases there can be obtained a similar effect as was mentioned above.

Figure 3:
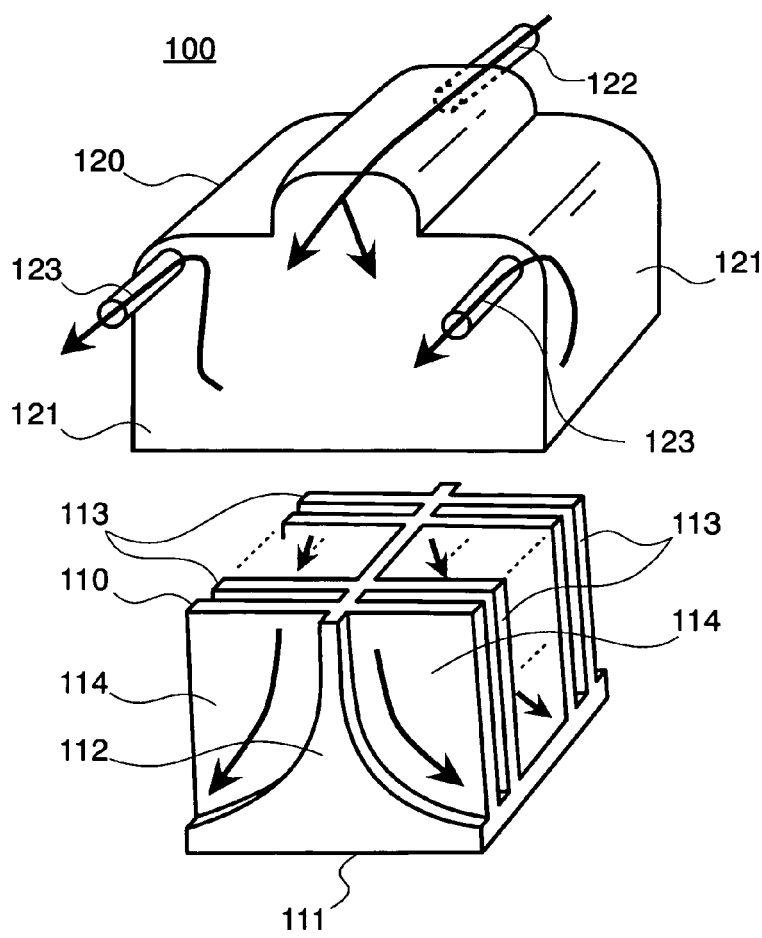
FIG. 3 is an exploded perspective view for showing the entire structures of the cooling jacket, according to other embodiment of the present invention.

Next, FIG. 3 attached herewith shows the structures of the cooling jacket, according to other embodiment of the present invention. However in this other embodiment, differing from that shown in FIG. 1 mentioned above, the inlet pipe 122 is attached on an upper portion of the cover portion 120, wherein the liquid coolant flows from the summit portion 112 of the base portion 110 into the fan-like shaped flow passages 114, which are made up on both sides thereof.

However, the liquid coolant passing through the fan-like shaped flow passages 114, which are made up on both sides of the base portion 110, thereafter, it is discharged into the outside thereof, from the outlet pipes 123 and 123, which are attached on both sides of the cover portion 120 (see arrows in the figure). However, also with the cooling jacket, according to this other embodiment, as is similar to that of the embodiment mentioned above, the base portion 110 mentioned above achieves the similar function because of the structures thereof, i.e., diffusing the heat of the heat-generating body 300, which is disposed on the heat-transfer surface in contact therewith, isotropically. For that reason, it is possible to lower the heat resistance within the said base portion 110, and thereby enabling to increase the efficiency of the cooling jacket 100, greatly. Also, it is possible to run the liquid coolant in the direction reversed to that mentioned above, i.e., flowing from the lower portions on both sides of the cover portion 120 directing to the upper portion thereof, and enabling to obtain the similar effect.

Also, with the solid portion (i.e., a hatching portion) of the base portion, it is preferable that it is elongated, with respect to the heat-transfer surface 111, i.e., into the horizontal direction and also the vertical direction from a center of the heat-transfer surface, and further that the width thereof comes downs to be small, gradually, as it separates from the center of the respective heat-transfer surfaces (i.e., the fan-like flow passages). However, it is needless to say that it may be more simplified in the configuration thereof (for example, the width of the respective ones coming down to be small, linearly, depending on the distance from the heat-transfer surface, or being equal in the width without change thereof), and that there can be obtained a similar effect as was mentioned above in such cases.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A cooling jacket for cooling a heat-generating element by transmission of heat generated by the heat-generating element into a fluid coolant inside of the cooling jacket, the cooling jacket being mounted within an electronic apparatus, comprising:
    a base portion;
    wherein said base portion includes
        a heat-transfer surface in proximity to a surface of said heat-generating element,
        a projecting portion extending into a direction perpendicular to said heat-transfer surface, and
        a plural number of wall portions, each being formed to extend into both a direction perpendicular to said heat-transfer surface and a direction perpendicular to said projecting portion, thereby defining flow passages between said plural number of wall portions for the fluid coolant; and
    a cover portion;
    wherein said cover portion is attached on said base portion by surrounding a periphery of said base portion, thereby defining a flow passage for guiding the fluid coolant into said base portion.

2. The cooling jacket, as is described in the claim 1, wherein said projecting portion of said base portion is shaped so that width of the projecting portion is narrowed as the vertical distance of said projecting portion from said heat-transfer surface increases.

3. The cooling jacket, as is described in the claim 1, wherein fan-shaped flow passages for the fluid coolant are disposed between wall portions in the base portion.

4. The cooling jacket, as is described in the claim 3, wherein said projecting portion of said base portion forms a summit portion with respect to a central portion of said heat-transfer surface, thereby defining the fan-shaped flow passages for the fluid coolant on two sides of said summit portion.

5. A cooling jacket for cooling a heat-generating element by transmission of the heat generated by the heat-generating element into a fluid coolant inside the cooling jacket, the cooling jacket mounted within an electronic apparatus, comprising:
    a base portion having a heat-transfer surface in proximity to a surface of said heat-generating element, wherein the base portion includes a plural number of wall portions, each wall portion extending in a direction perpendicular to said heat-transfer surface, thereby defining flow passages for the fluid coolant between said plural number of wall portions; and
    a cover portion attached on said base portion so as to surround a periphery said base portion, thereby defining a passage for guiding the fluid coolant into said base portion;
    wherein said base portion has a configuration thermally isotropic to said heat-generating element in proximity to said heat-transfer surface of said base portion.

6. A cooling jacket for cooling a heat-generating element by transmission of the heat generated by the heat-generating element into a fluid coolant inside the cooling jacket, the cooling jacket mounted within an electronic apparatus, comprising:
    a base portion, which includes
        a lower surface which is a heat transfer surface in proximity to a surface of the heat-generating element, and
        a projecting portion disposed on the upper surface of the base portion and extending simultaneously in a longitudinal horizontal direction from the center of the heat transfer surface and also in the vertical direction perpendicular to the heat transfer surface, and
        a plurality of wall portions extending simultaneously perpendicularly from the heat-transfer surface and from the projecting portion, the wall portions extending parallel to and at a distance from each other, thereby defining flow passages for the fluid coolant between the wall portions;
    an inlet pipe for introducing the fluid coolant;
    an outlet pipe for discharging the fluid coolant; and a cover portion that comprises a concave shape, and is attached to the upper portion of the base portion along the periphery of the upper portion of the base portion in a fluid-tight manner;

wherein the cover portion includes one of
(1) a lower guide portion on each side extending in longitudinal direction, and the inlet pipe is attached in the front side of one of the lower guide portions, and the outlet pipe is attached in the back side of another of the lower guide portions, and
(2) a lower guide portion on each side extending in longitudinal direction and an upper guide portion extending in longitudinal direction, the inlet pipe is attached to the upper guide portion, and the outlet pipe is attached to one of the lower guide portions and another outlet pipe is attached to another of the lower guide portions; and wherein the flow direction of the fluid coolant is reversible.

7. A cooling jacket according to claim 6, wherein a width of the projecting portion of the base portion gradually becomes narrower in a vertical direction as a distance from the heat transfer surface increases.

8. A cooling jacket according to claim 7, wherein the shape of the projecting portion creates flow passages that have a substantially triangular shaped form.

9. A cooling jacket according to claim 7, wherein the shape of the projecting portion creates flow passages that have a substantially fan shaped form.

10. A cooling jacket according to claim 6, wherein the width of the projecting portion of the base portion is constant in the vertical direction, such that the flow passages have a substantially rectangular shaped form.

* * * * *